(12) United States Patent
Lee (10) Patent No.: US 7,709,840 B2
(45) Date of Patent: May 4, 2010

(54) BOTTOM GATE THIN FILM TRANSISTOR, FLAT PANEL DISPLAY HAVING THE SAME AND METHOD OF FABRICATING THE SAME

(75) Inventor: Keun-Soo Lee, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 132 days.

(21) Appl. No.: 11/232,290

(22) Filed: Sep. 21, 2005

(65) Prior Publication Data
US 2006/0071211 A1 Apr. 6, 2006

(30) Foreign Application Priority Data
Oct. 6, 2004 (KR) .................. 10-2004-0079693

(51) Int. Cl.
*H01L 29/04* (2006.01)
(52) U.S. Cl. .............. 257/59; 257/57; 257/72; 257/E21.615; 257/E27.111
(58) Field of Classification Search .............. 257/57–59
See application file for complete search history.

(56) References Cited

U.S. PATENT DOCUMENTS

| 6,278,130 | B1 * | 8/2001 | Joo et al. ................. 257/59 |
| 6,692,996 | B2 * | 2/2004 | Lee et al. ................. 438/149 |
| 6,695,955 | B2 * | 2/2004 | Hwang et al. .......... 204/192.12 |
| 6,727,121 | B2 * | 4/2004 | Joo et al. ................. 438/149 |
| 6,864,130 | B2 * | 3/2005 | Koo et al. ................. 438/166 |
| 2002/0058365 | A1 * | 5/2002 | Lee et al. ................. 438/166 |
| 2002/0074548 | A1 * | 6/2002 | Lee et al. ................. 257/59 |
| 2002/0137267 | A1 * | 9/2002 | Joo et al. ................. 438/166 |
| 2002/0137310 | A1 * | 9/2002 | Joo et al. ................. 438/487 |
| 2002/0177283 | A1 * | 11/2002 | Hwang et al. ............ 438/300 |

(Continued)

FOREIGN PATENT DOCUMENTS

CN 1351371 A 5/2002

(Continued)

OTHER PUBLICATIONS

Office Action issued by Korean Patent Office dated Apr. 28, 2006.

(Continued)

*Primary Examiner*—Dung A. Le
(74) *Attorney, Agent, or Firm*—Knobbe Martens Olson & Bear LLP (57) ABSTRACT

A bottom gate thin film transistor (TFT), a flat panel display having the same, and a method of fabricating the same are disclosed. The TFT comprises a gate electrode disposed on a substrate, and a gate insulating layer disposed on the gate electrode. A semiconductor layer is disposed on the gate insulating layer and crossing over the gate electrode, and is crystallized by an MILC technique. An inter-insulating layer is disposed on the semiconductor layer and comprises source and drain contact holes which expose portions of the semiconductor layer. The source and drain contact holes are separated from at least one edge of the semiconductor layer crossing over the gate electrode. The semiconductor layer comprises conductive MIC regions corresponding to the exposed portions of the semiconductor layer in the source and drain contact holes.

12 Claims, 8 Drawing Sheets

U.S. PATENT DOCUMENTS

2003/0085401 A1* 5/2003 Joo et al. .................. 257/59
2003/0094613 A1* 5/2003 Joo et al. .................. 257/59
2004/0257487 A1* 12/2004 Lee et al. .................. 349/43

FOREIGN PATENT DOCUMENTS

| CN | 1377020 A | 10/2002 |
|---|---|---|
| CN | 1454030 A | 11/2003 |
| CN | 1476282 A | 2/2004 |
| JP | 11-284198 | 10/1999 |
| KR | 1020000074449 | 12/2000 |
| KR | 1020020033373 A | 5/2002 |

OTHER PUBLICATIONS

Korean Patent Application No. 10-1999-0018386 filed on May 21, 2005.

* cited by examiner

BOTTOM GATE THIN FILM TRANSISTOR, FLAT PANEL DISPLAY HAVING THE SAME AND METHOD OF FABRICATING THE SAME

CROSS-REFERENCE TO RELATED APPLICATION

This application claims priority to and the benefit of Korean Patent Application No. 10-2004-79693, filed Oct. 6, 2004, the disclosure of which is incorporated herein by reference in its entirety.

BACKGROUND OF THE INVENTION

1. Field of the Invention

The present invention relates to a thin film transistor (TFT) and a flat panel display having the same and, more particularly, to a bottom gate TFT and a flat panel display having the same.

2. Description of the Related Technology

In general, a thin film transistor (TFT) includes a semiconductor layer, a gate electrode, a source electrode, and a drain electrode. The semiconductor layer includes source and drain regions, and a channel region interposed therebetween. The semiconductor layer may be made of polysilicon or amorphous silicon. Because the polysilicon is higher in electron mobility than the amorphous silicon, the polysilicon is usually used as the semiconductor layer.

The polysilicon TFT is classified into a top gate type that a gate electrode is disposed above a channel region and a bottom gate type that a gate electrode is disposed below a channel region. The bottom gate polysilicon TFT has an advantage in that a low temperature process may be performed compared to the top gate polysilicon TFT.

Korean Patent Registration No. 10-0317640 discloses a bottom gate polysilicon TFT and is incorporated herein by reference.

Figure 1A:
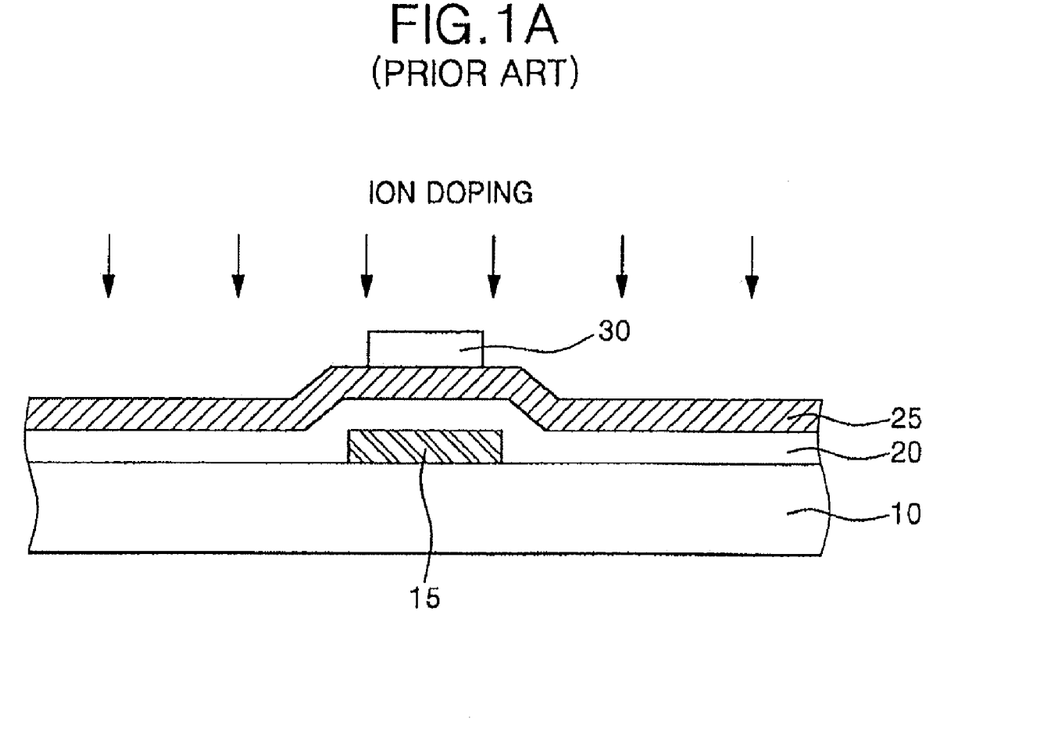
FIGS. 1A and 1B are cross-sectional views illustrating a prior art method of fabricating a TFT.
Figure 1B:
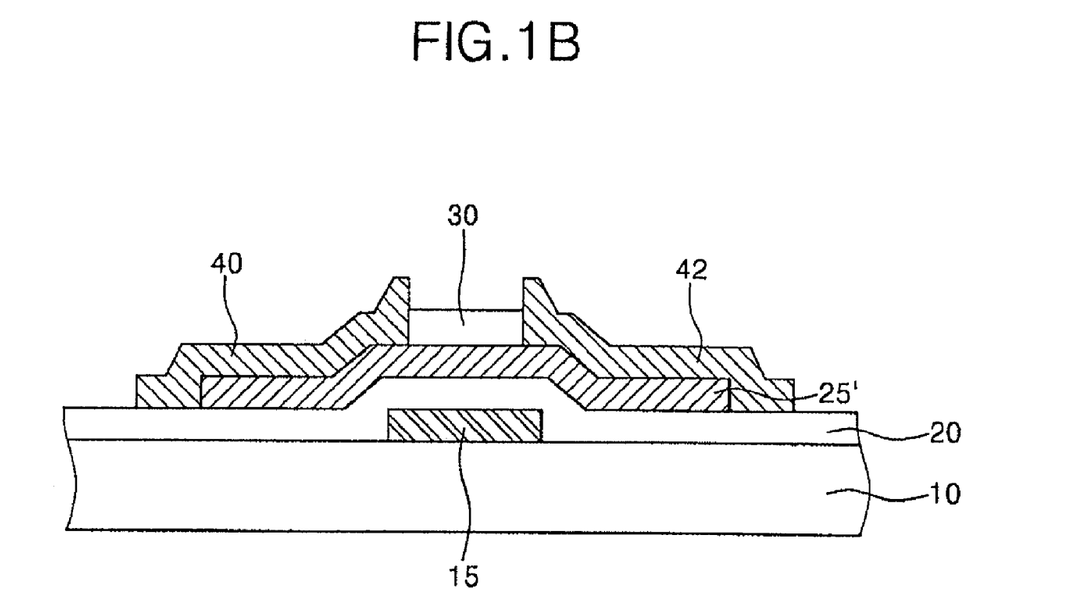
Figure 1C:
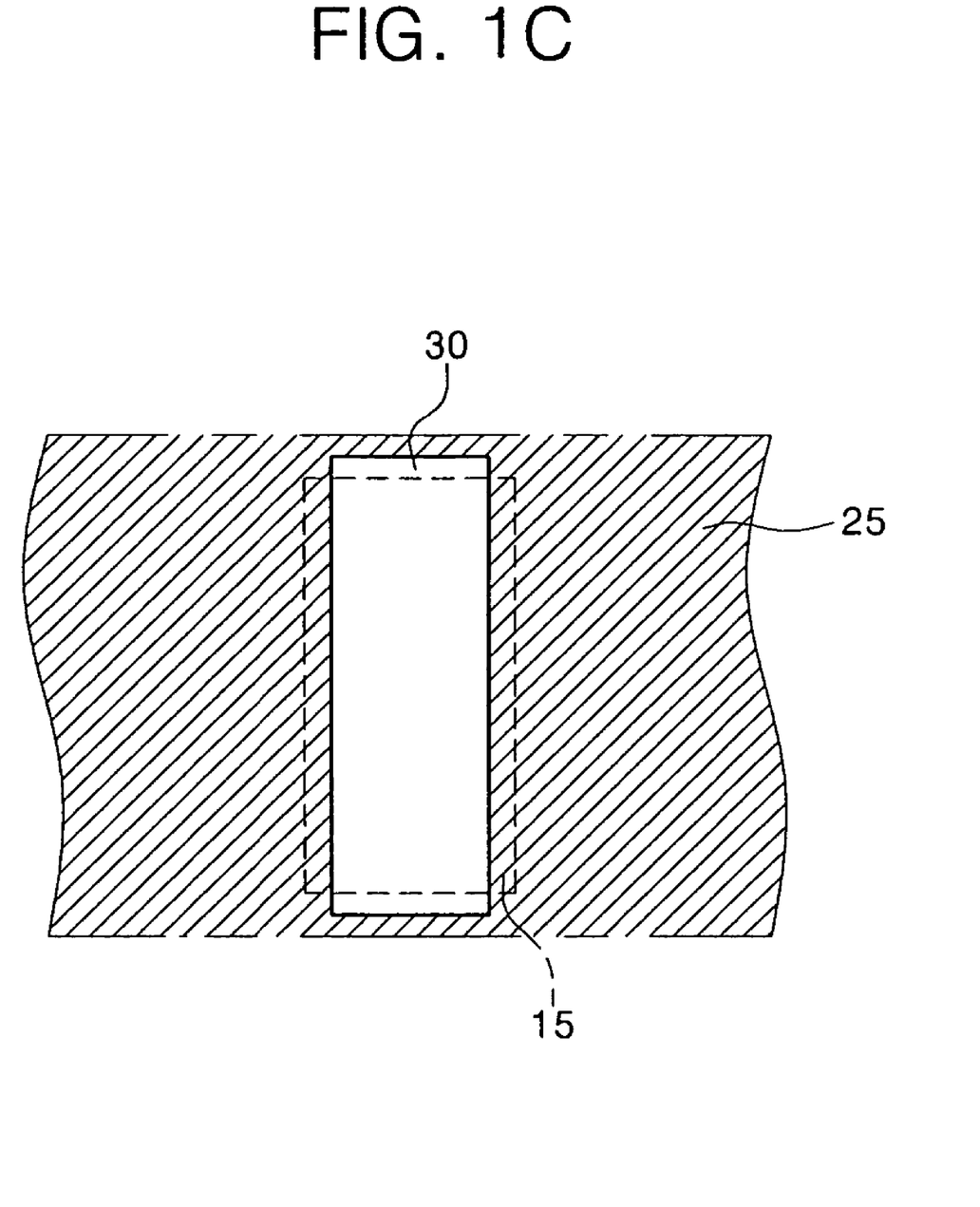
FIG. 1C is a plan view corresponding to FIG. 1A.

FIGS. 1A and 1B are cross-sectional views illustrating a method of fabricating the TFT disclosed in Korean Patent Registration No. 10-0317640, and FIG. 1C is a plan view corresponding to FIG. 1A.

Referring to FIG. 1A, a gate electrode 15 is formed on a substrate 10, and an insulating layer 20 and a pure amorphous silicon layer 25 are sequentially formed over the gate electrode 15 and the substrate 10. An etch stop layer 30 is formed on the pure amorphous silicon layer 25, and then the pure amorphous silicon layer 25 is metal-treated. When the etch stop layer 30 is formed in the shape of an island disposed in the same direction as the gate electrode 15, the entire pure amorphous silicon layer 25 surrounding the etch stop layer 30 may be metal-treated (see FIG. 1C). The metal-treated pure amorphous silicon layer 25 is subjected to an ion doping process using the etch stop layer 30 as a doping barrier layer.

Following the ion doping process, a direct high voltage is applied to a surface of the ion-doped pure amorphous silicon layer 25 to crystallize the ion-doped pure amorphous silicon layer 25. The pure amorphous silicon layer 25 below the etch stop layer 30 may be crystallized laterally without directly contacting a metal. However, because the pure amorphous silicon layer 25 surrounding the etch stop layer 30 is metal-treated, the crystallized silicon layer below the etch stop layer 30 may be contaminated due to metal introduced from a peripheral region of the etch stop layer 30.

Referring to FIG. 1B, the crystallized polysilicon layer is patterned in the shape of an island to form an active layer 25'. Subsequently, a source electrode 40 and a drain electrode 42 are formed over the active layer 25' and the insulating layer 20, thereby completing the TFT. In the TFT, the active layer 25' below the etch stop layer 30 serves as a channel region. As described above, however, the channel region may be contaminated by metal from the metal treatment, thereby leading to a relatively high leakage current. This high leakage current may also negatively effect the performance of an organic light emitting diode coupled to the transistor in a pixel circuit, thereby negatively effecting the performance of a flat panel display incorporating such a pixel circuit.

SUMMARY OF CERTAIN INVENTIVE ASPECTS

Embodiments of the invention, therefore, solve aforementioned problems associated with conventional devices by providing a bottom gate TFT having less metal-contamination and a low leakage current, and methods of fabricating the same.

Embodiments of the invention also include a flat panel display low in contamination potential by employing a bottom gate TFT, wherein the bottom gate TFT has less metal contamination a low leakage current.

In one embodiment of the invention, a TFT comprises a gate electrode disposed on a substrate, and a gate insulating layer disposed on the gate electrode. A semiconductor layer is disposed on the gate insulating layer to cross over the gate electrode, wherein the semiconductor layer is crystallized by a metal induced lateral crystallization (MILC) technique. An inter-insulating layer is disposed on the semiconductor layer and comprises source and drain contact holes. The source and drain contact holes expose portions of the semiconductor layer and are separated from at least one edge of the semiconductor layer crossing over the gate electrode. Source and drain electrodes are disposed on the exposed portions of the semiconductor layer in the source and drain contact holes, respectively. In some embodiments, the semiconductor layer comprises conductive metal induced crystallization (MIC) regions corresponding to the portions of the semiconductor layer exposed in the source and drain contact holes. The semiconductor layer may cross over the gate electrode in a substantially orthogonal configuration, for example.

In another embodiment of the invention, a TFT comprises a gate electrode disposed on a substrate, and a gate insulating layer disposed on the gate electrode. The TFT further comprises a semiconductor layer disposed on the gate insulating layer and crossing over the gate electrode. The TFT also comprises an inter-insulating layer disposed on the semiconductor layer, wherein the inter-insulating layer comprises source and drain contact holes that expose portions of the semiconductor layer, wherein edges of the source and drain contact holes are separated from at least one edge of the semiconductor layer crossing over the gate electrode. Source and drain electrodes are respectively disposed on the exposed portions of the semiconductor layer. The semiconductor layer comprises conductive regions corresponding to the portions of the semiconductor layer exposed in the source and drain contact holes.

In yet another embodiment of the invention, a flat panel display includes a TFT and a pixel electrode, wherein the TFT is one of the TFT's described above, and wherein the pixel electrode contacts one of the source electrode and the drain electrode of the TFT.

In still another embodiment of the invention, a method of fabricating a TFT comprises forming a gate electrode on a substrate, and forming a gate insulating layer on the gate electrode. The method further comprises forming a semiconductor layer on the gate insulating layer and crossing over the gate electrode. The method also comprises forming an inter-insulating layer to cover the semiconductor layer. The method further comprises forming source and drain contact holes in the inter-insulating layer that expose portions of the semiconductor layer, wherein the source and drain contact holes are separated from at least one edge of the semiconductor layer crossing over the gate electrode. The method also comprises doping conductive impurities into the exposed portions of the semiconductor layer using the inter-insulating layer as a mask to form conductive regions. The method further includes forming the source and drain electrodes on the conductive regions.

BRIEF DESCRIPTION OF THE DRAWINGS

The above and other features of the invention will be described in reference to certain exemplary embodiments thereof with reference to the drawings in which.

DETAILED DESCRIPTION OF CERTAIN INVENTIVE EMBODIMENTS

Reference will now be made in detail to embodiments of the invention, examples of which are illustrated in the accompanying drawings, wherein like reference numerals refer to the like elements throughout. The embodiments are described below in order to explain the present invention by referring to the figures.

FIGS. 2A, 3A, 4A, 5A, and 6A are plan views illustrating methods of fabricating a bottom gate TFT according to an embodiment of the invention, and FIGS. 2B, 3B, 4B, 5B, and 6B are cross-sectional views taken along the line I-I' of FIGS. 2A, 3A, 4A, 5A, and 6A, respectively.

Figure 2A:
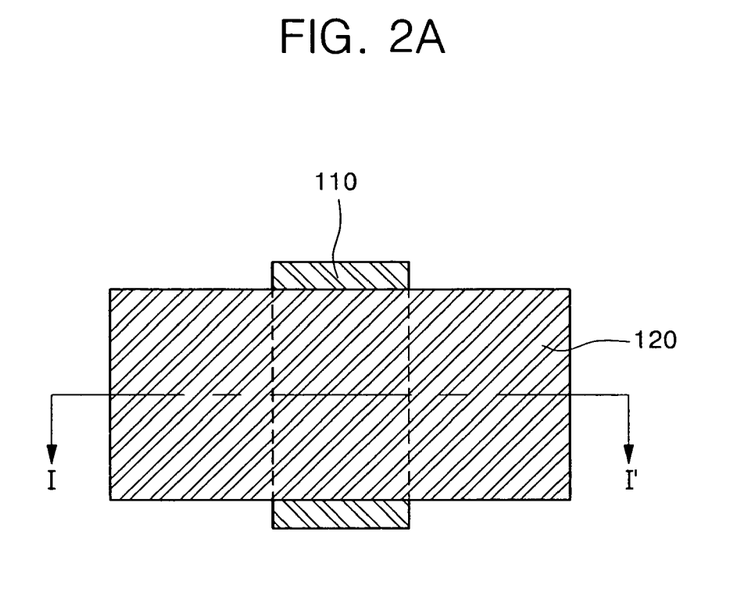
FIGS. 2A, 3A, 4A, 5A, and 6A are plan views illustrating methods of fabricating a bottom gate TFT according to an embodiment of the invention.
Figure 2B:
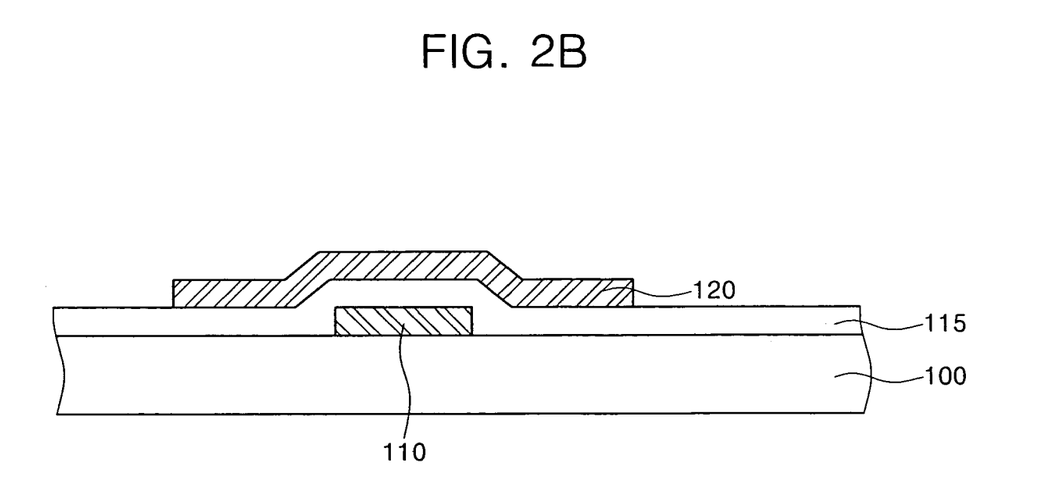
FIGS. 2B, 3B, 4B, 5B, and 6B are cross-sectional views taken along the line I-I' of FIGS. 2A, 3A, 4A, 5A, and 6A, respectively.

Referring to FIGS. 2A and 2B, a substrate 100 is provided, which may comprise monocrystalline silicon, glass, plastic, sapphire, or quartz, for example. A gate electrode 110 is formed on the substrate 100, and the gate electrode 110 may comprise a material selected from the group consisting of aluminum (Al), an aluminum alloy, molybdenum (Mo), and a molybdenum alloy. In one embodiment, the gate electrode 110 is formed of a molybdenum-tungsten alloy layer having excellent conductivity and stability characteristics.

A gate insulating layer 115 is formed over the entire substrate and covering the gate electrode 110. The gate insulating layer 115 may comprise a silicon oxide layer, a silicon oxynitride (SiON) layer, a silicon nitride layer, or a multi-layer thereof, for example. An amorphous silicon layer is formed on the gate insulating layer 115 and patterned to form a semiconductor layer 120 which crosses over the gate electrode 110 in a substantially orthogonal configuration, for example. The semiconductor layer 120 may be formed as a straight line having a predetermined width.

Figure 3A:
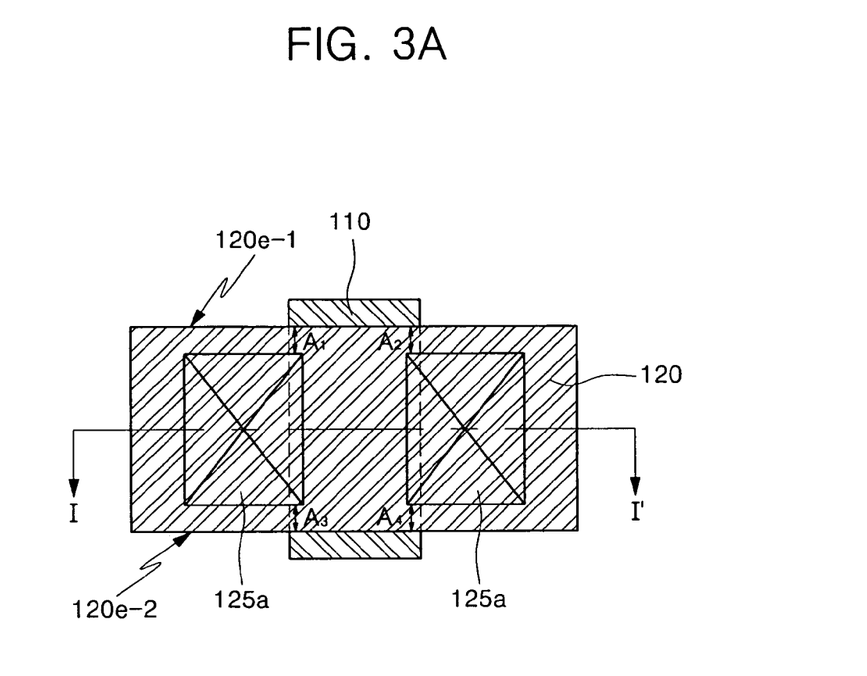
Figure 3B:
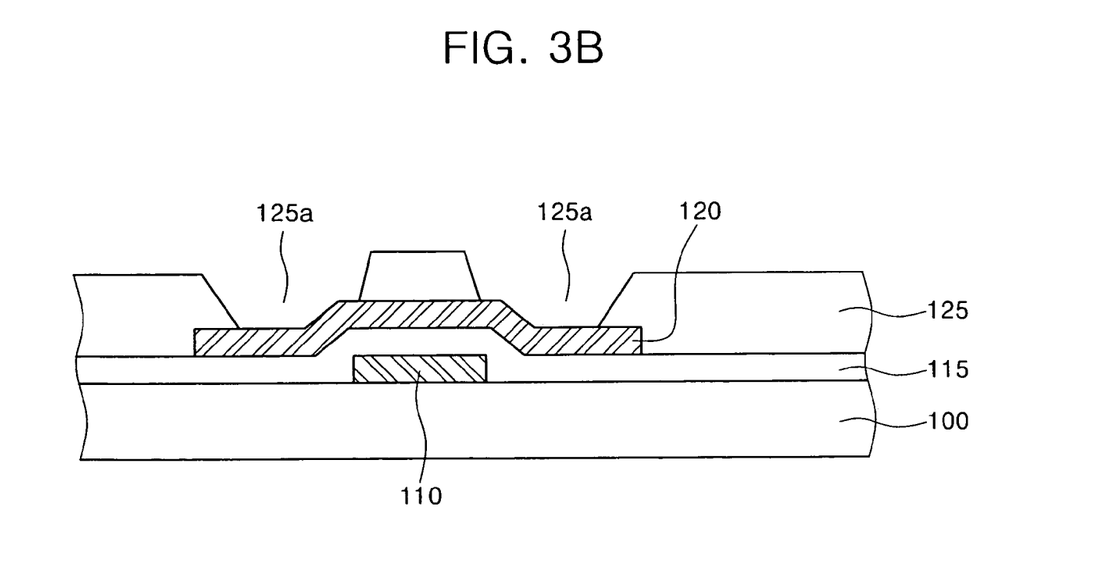

Referring to FIGS. 3A and 3B, an inter-insulating layer 125 is formed over substantially the entire surface of the device to cover the semiconductor layer 120. The inter-insulating layer 125 may comprise a silicon oxide layer, a silicon oxynitride (SiON) layer, a silicon nitride layer, or a multi-layer thereof, for example. Source and drain contact holes 125a are formed in the inter-insulating layer 125 to expose portions at both ends of the semiconductor layer 120. The edges of the source and drain contact holes 125a are spaced apart from at least one of the two edges 120e-1 or 120e-2 of the semiconductor layer 120 that cross the gate electrode 110 in a substantially orthogonal configuration, wherein the edges of the source and drain contact holes 125a may be spaced apart from the edges 120e-1 or 120e-2 by a minimum or predetermined distance ($A_1$, $A_2$, $A_3$, $A_4$; see FIG. 3A). In some embodiments, the edges of the source and drain contact holes 125a are spaced apart from both edges 120e-1 and 120e-2 of the semiconductor layer crossing the gate electrode. Thereby, the inter-insulating layer 125, including the source and drain contact holes 125a, does not expose the edges of the semiconductor layer 120.

Figure 4A:
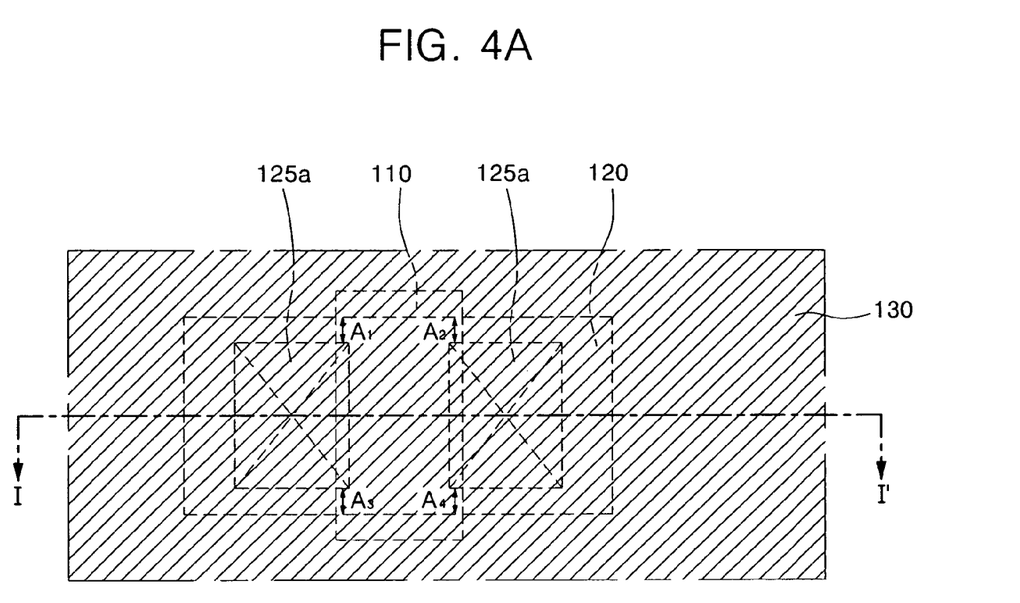
Figure 4B:
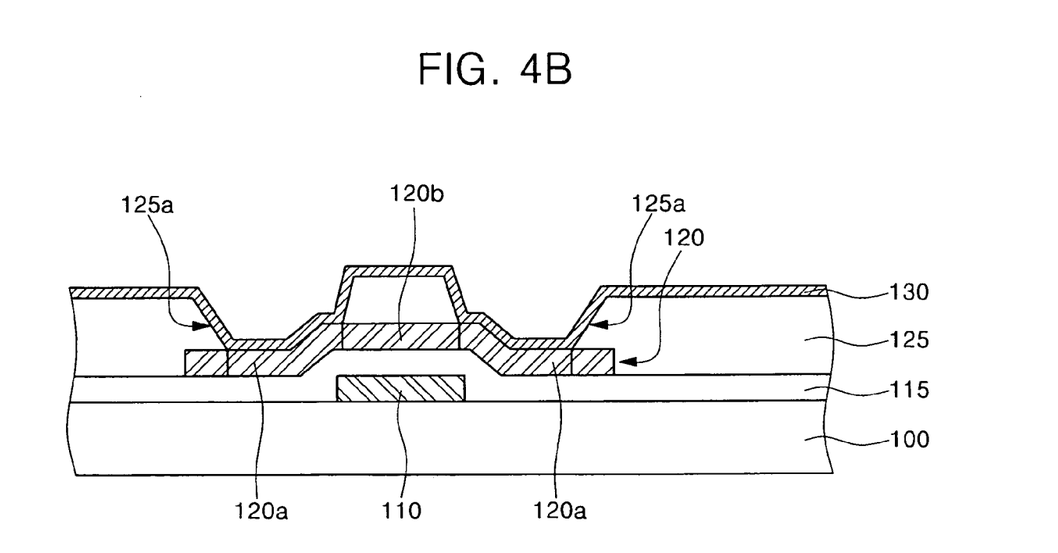

Referring to FIGS. 4A and 4B, a metal layer 130 for inducing crystallization is formed on the exposed portions of the semiconductor layer 120 in the source and drain contact holes 125a. The crystallization-induced metal layer 130 selectively contacts the portions of the semiconductor layer 120 that are exposed by the source and drain contact holes 125a in the inter-insulating layer 125. The crystallization-induced metal layer 130 may comprise at least one of Ni, Pd, Ti, Ag, Au, Al, Sn, Sb, Cu, Co, Cr, Mo, Tr, Ru, Rh, and Cd. In one embodiment, the crystallization-induced metal layer 130 comprises Ni, which may be less mismatched with silicon and may crystallize the amorphous silicon at a low temperature. The crystallization-induced metal layer 130 may have a thickness of several angstroms to about 200 Å, for example.

Subsequent to formation of the crystallization-induced metal layer 130, the device is subjected to an annealing process. The annealing process may be performed using a furnace annealing technique, a rapid thermal annealing (RTA) technique, a laser irradiation technique, or an ultraviolet irradiation technique, for example. Due to the annealing process, a metal silicide layer is formed at an interface between the semiconductor layer 120 and the crystallization-induced metal layer 130, and a metal induced crystallization (MIC) region 120a is formed in which the crystallization is induced by the metal silicide layer. The metal silicide layer of the MIC region 120a crystallizes the regions of the semiconductor layer 120 at peripheral to the MIC region 120a using a metal induced lateral crystallization (MILC) technique to laterally grow needle-like crystal grains. As a result, the semiconductor layer 120 is crystallized by the MILC technique, the crystallized semiconductor layer 120 has the MIC region 120a at a region corresponding to the source and drain contact holes 125a, and an MILC region 120b at regions other than the MIC region 120a. In advantageous embodiments, the semiconductor layer 120 that is crystallized by the MILC technique has more uniform crystallinity than a laser crystallization technique.

A region wherein the crystallization-induced metal layer 130 and the semiconductor layer 120 contact each other may be reduced by forming the source and drain contact holes 125a separated from the edge 120e-1 or 120e-2 of the semiconductor layer 120 by a predetermined distance, and by selectively contacting the crystallization-induced metal layer 130 and the semiconductor layer 120 through the source and drain contact holes 125a. As a result, contamination of a portion of the semiconductor layer 120 between the source and drain contact holes 125a (a channel region which will be discussed in further detail below) may be reduced. Thereby, a leakage current of the TFT may be reduced.

The region that the crystallization-induced metal layer 130 and the semiconductor layer 120 contact each other is reduced as the distance between the source and drain contact holes 125a and the edge 120e-1 or 120e-2 of the semiconductor layer 120 increases. In one embodiment, the distances $A_1$, $A_2$, $A_3$ or $A_4$ between the edges of the source and drain contact holes 125a and the edge 120e-1 or 120e-2 of the semiconductor layer 120 crossing over the gate electrode 110 is about 0.5 µm or more. In other embodiments, the distance $A_1$, $A_2$, $A_3$ or $A_4$ is less than about 10 µm when the size of the semiconductor layer 120 exposed by the source and drain contact holes 125a is considered.

In some embodiments, the inter-insulating layer 125 has sufficient thickness such that the crystallization-induced metal layer 130 cannot infiltrate into the semiconductor layer 120. In certain embodiments, the inter-insulating layer 125 has a thickness of about 1000 to 5000 Å.

Figure 5A:
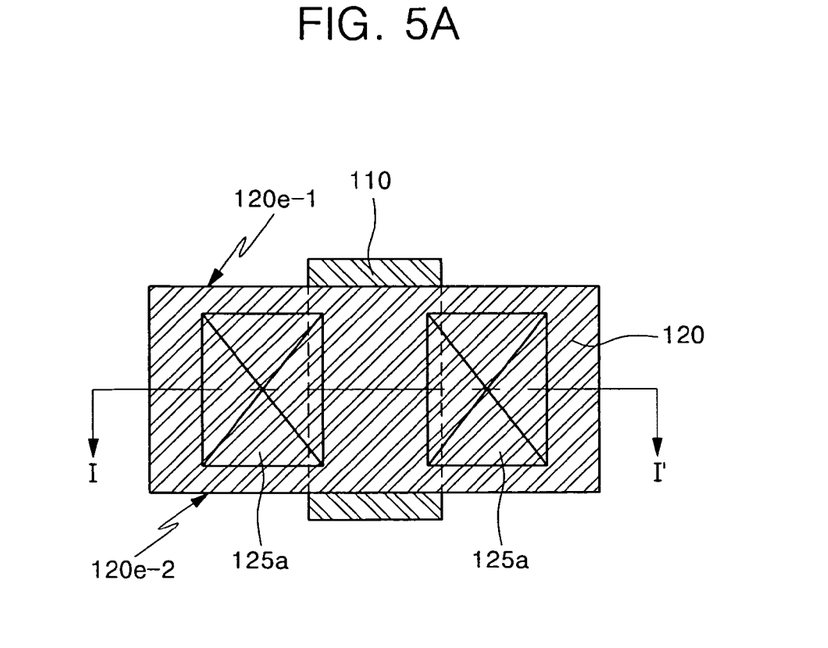
Figure 5B:
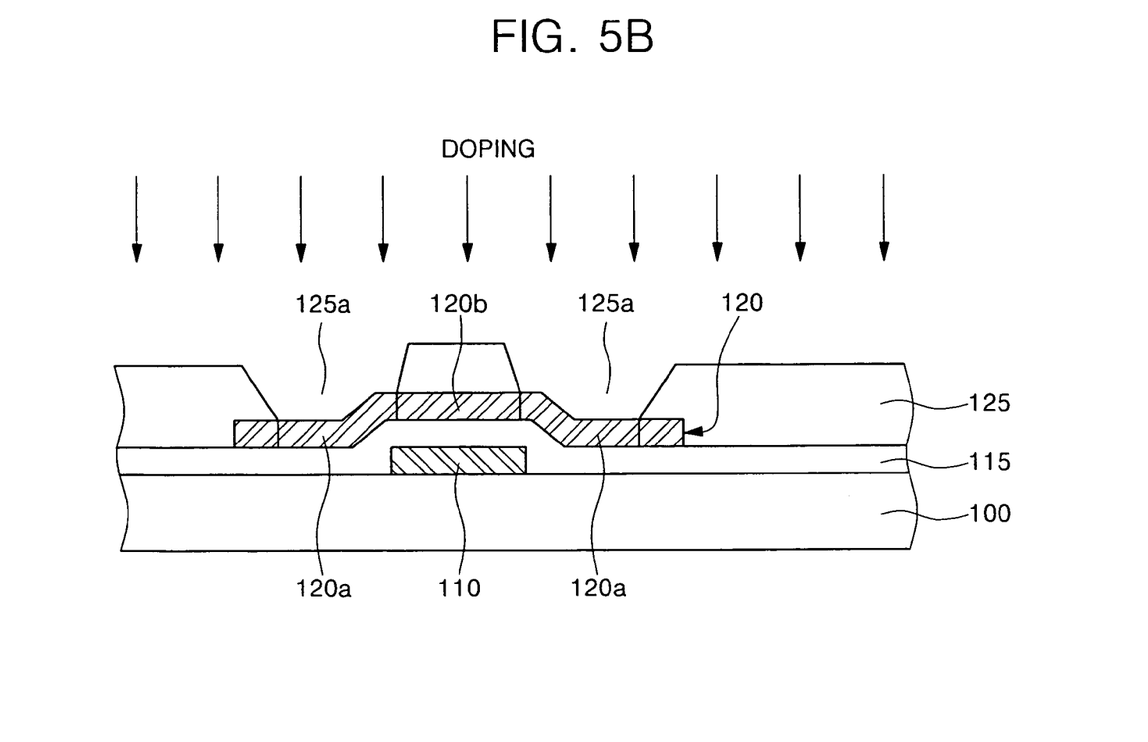

Referring to FIGS. 5A and 5B, the crystallization-induced metal layer 130 (FIGS. 4A and 4B) has been removed to expose the semiconductor layer 120 in the source and drain contact holes 125a. Conductive impurities are doped into the exposed portions of the semiconductor layer 120, particularly the MIC regions 120a, using the inter-insulating layer 125 as a mask. The conductive impurities may comprise a p-type impurity such as boron (B) or an n-type impurity such as phosphorus (P) or arsenic (As), for example. Thereby, a conductive region is formed in the semiconductor layer 120, wherein the conductive MIC region 120a corresponds to the exposed portion of the semiconductor layer 120. The conductive MIC regions 120a serve as source and drain regions, and the MILC region 120b between the conductive MIC regions 120a serves as a channel region.

In certain embodiments, the order of the MILC crystallization process and the impurity doping process may be altered. In one embodiment, the source and drain contact holes 125a are formed in the inter-insulating layer 125, and the conductive impurities are doped using the inter-insulating layer 125 as a mask to form the conductive regions. Thereafter, the crystallization-induced metal layer is formed on the conductive regions, and the substrate having the crystallization-induced metal layer is subjected to the annealing, thereby forming the conductive MIC regions 120a and the MILC region 120b. After annealing the substrate, the crystallization-induced metal layer may be removed.

As described above, by forming the source and drain contact holes 125a in the inter-insulating layer 125, and doping the conductive impurities into the exposed portions of the semiconductor layer 120 in the source and drain contact holes 125a using the inter-insulating layer 125 as a mask to form the conductive regions (the source and drain regions), a separate mask to form the source and drain regions is not required. Therefore, by reducing the number of masks needed for formation of the device, the manufacturing process may be simplified.

Figure 6A:
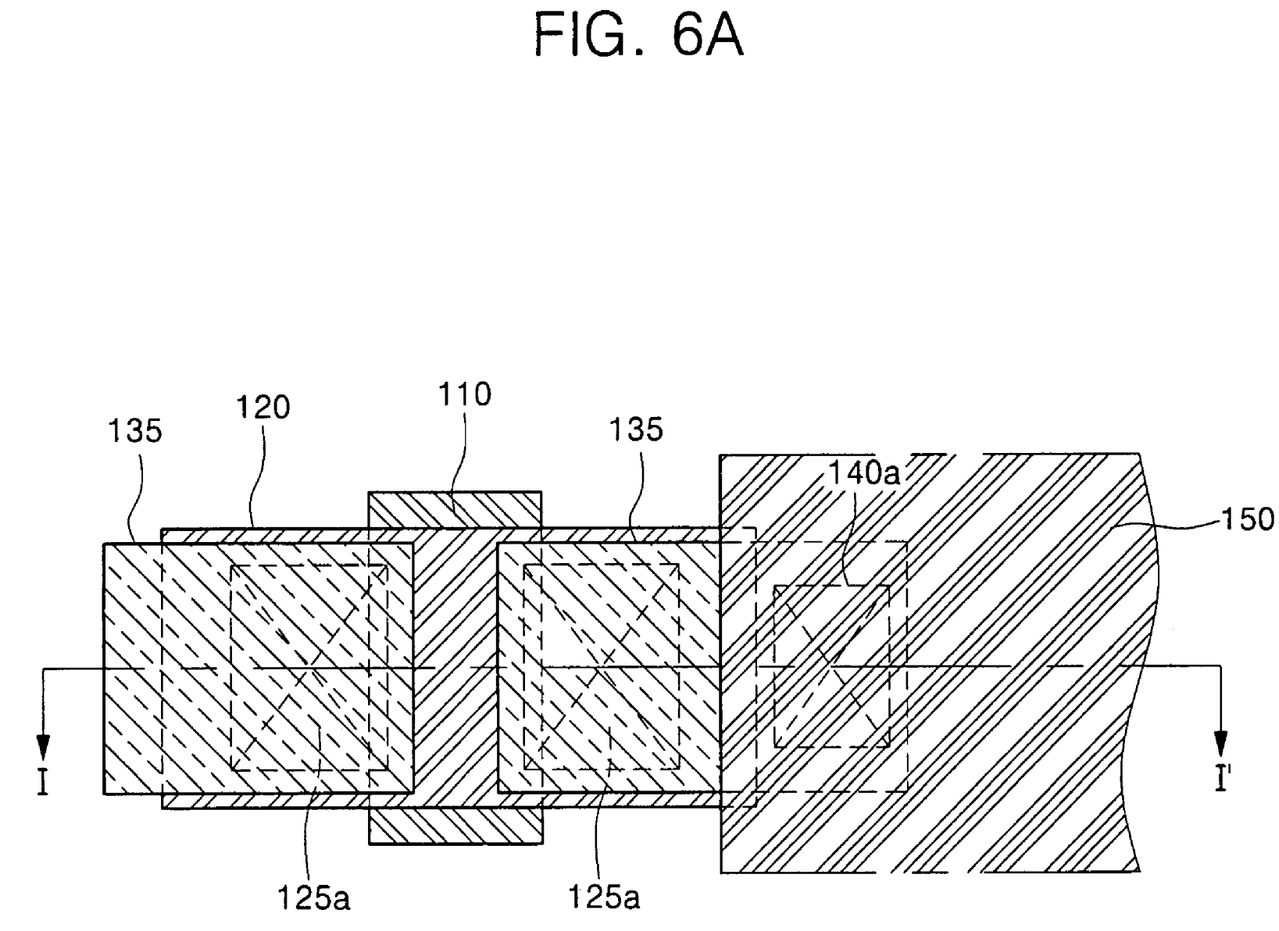
Figure 6B:
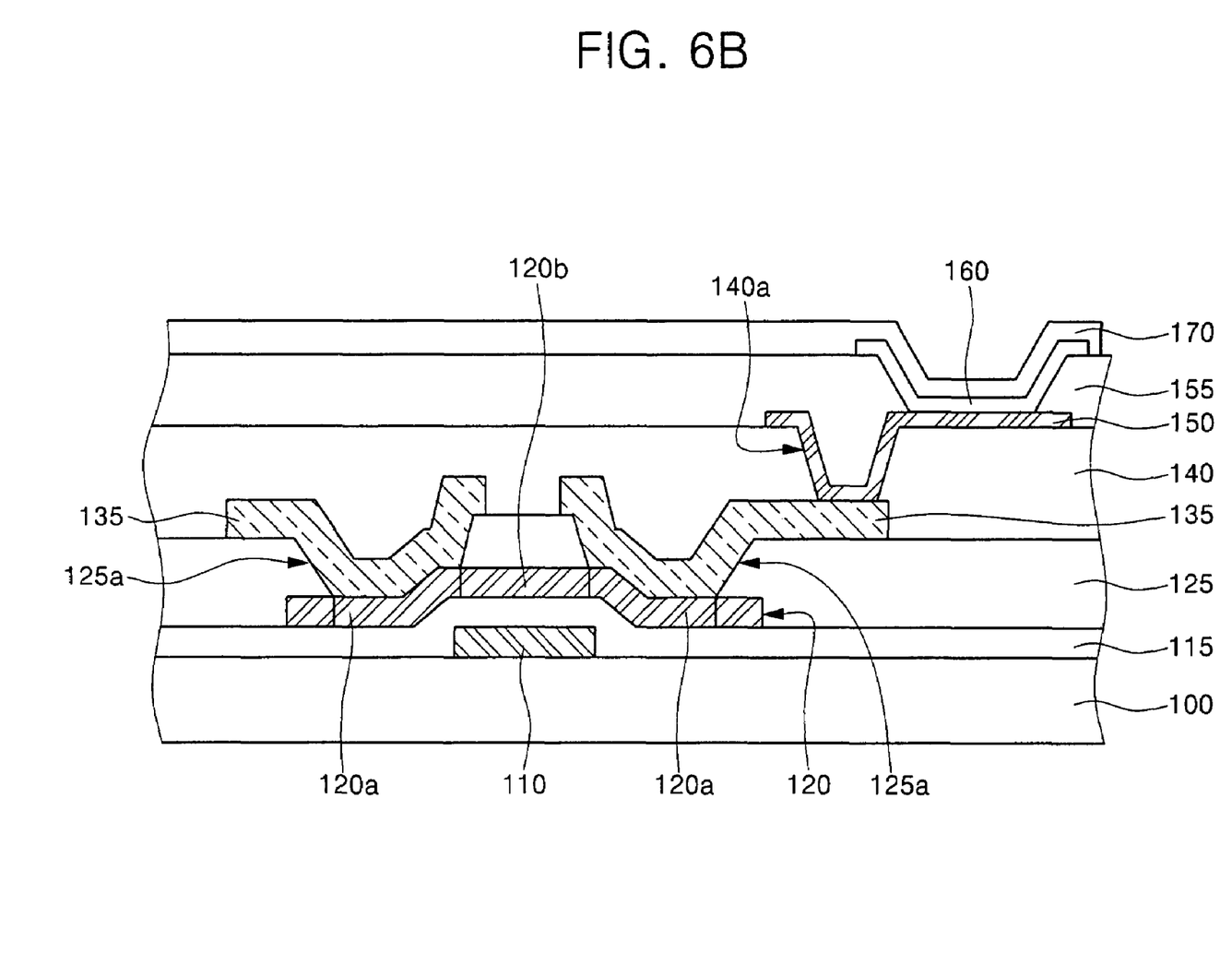

Referring to FIGS. 6A and 6B, a conductive layer is deposited on the conductive MIC regions 120a and patterned to form source and drain electrodes 135. As a result, the source and drain electrodes 135 are disposed on the exposed portions of the semiconductor layer 120 in the source and drain contact holes 125a so as to directly contact the conductive MIC regions 125a. Accordingly, the gate electrode 110, the semiconductor layer 120 and the source and drain electrodes 135 form the bottom gate TFT.

In one embodiment, the source and drain electrodes 135 are in ohmic contact with the semiconductor layer 120 due to the doped conductive MIC regions 125a. The source and drain electrodes 135 may comprise at least one of aluminum (Al), an aluminum alloy, molybdenum (Mo), and a molybdenum alloy. In one embodiment, the source and drain electrodes 135 comprise a molybdenum-tungsten alloy layer having excellent conductivity and stability characteristics.

A passivation layer 140 is formed on the source and drain electrodes 135. The passivation layer 140 may comprise a silicon oxide layer, a silicon oxynitride (SiON) layer, a silicon nitride layer, or a multi-layer thereof, for example. In one embodiment, the passivation layer 140 is formed of a silicon nitride layer to efficiently passivate the elements formed below the layer. A via 140a is formed in the passivation layer 140 to expose one or more of the source and drain electrodes 135. A pixel electrode layer is formed on the exposed portion of the source and drain electrodes 135 and the passivation layer 140, and patterned to form a pixel electrode 150 that contacts one of the source and drain electrodes 135 exposed through the via 140a.

Embodiments of the method may further comprise formation of an organic light emitting diode (OLED), comprising forming a pixel defining layer 155 to expose a portion of the pixel electrode 150, and an organic functional layer 160 having at least an emission layer on the exposed portion of the pixel electrode 150. An opposite electrode 170 is formed on the organic functional layer 160, thereby completing the OLED. In some embodiments, the organic functional layer 160 further comprises a charge transport layer and/or a charge injection layer. The pixel electrode 150, the organic functional layer 160, and the opposite layer 170 form the OLED. The OLED is connected to the TFT to emit light in response to an electrical current supplied through the TFT. Therefore, by reducing a leakage current of the TFT, display problems due to the OLED connected to the TFT may be improved.

As described above, the leakage current of the TFT may be reduced by reducing the contact region of the crystallization-induced metal layer and the semiconductor layer. The contact region may be reduced using the source and drain contact holes in a crystallization process of the semiconductor layer of the bottom gate TFT using the MILC technique. Also, defects in a display, such as a flat panel display, employing the TFT may be reduced.

The separate mask used to form the source and drain regions may be omitted by forming the source and drain contact holes in the inter-insulating layer and doping the conductive impurities into the exposed portions of the semiconductor layer in the source and drain contact holes. Embodiments of such a process comprise using the inter-insulating layer as a mask to form the conductive regions (the source and drain regions). As a result, the manufacturing process may be simplified.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A thin film transistor (TFT) comprising:
   a gate electrode disposed on a substrate;
   a gate insulating layer disposed on the gate electrode;
   a semiconductor layer disposed on the gate insulating layer and crossing over the gate electrode, wherein the semiconductor layer is crystallized by a metal induced lateral crystallization (MILC) technique;
   an inter-insulating layer disposed on the semiconductor layer and comprising source and drain contact holes that expose portions of the semiconductor layer, wherein at least one edge of each of the source and drain contact holes of the inter-insulating layer overlaps the gate electrode; and source and drain electrodes disposed on the exposed portions of the semiconductor layer in the source and drain contact holes, respectively, wherein the semiconductor layer comprises metal induced crystallization (MIC) regions corresponding to the exposed portions of the semiconductor layer in the source and drain contact holes.

2. The TFT of claim 1, wherein the source and drain electrodes directly contact the exposed portions of the semiconductor layer.

3. The TFT of claim 1, wherein edges of the source and drain contact holes are separated from all edges of the semiconductor layer crossing over the gate electrode by a minimum distance.

4. The TFT of claim 1, wherein the minimum distance between the edges of the source and drain contact holes and the edge of the semiconductor layer crossing over the gate electrode is in a range of about 0.5 µm to about 10 µm.

5. The TFT of claim 1, wherein the inter-insulating layer has a thickness of about 1000 to 5000 Å.

6. The TFT of claim 1, wherein the semiconductor layer crosses over the gate electrode in a substantially orthogonal configuration.

7. A thin film transistor (TFT) comprising:
a gate electrode disposed on a substrate;
a gate insulating layer disposed on the gate electrode;
a semiconductor layer disposed on the gate insulating layer and crossing over the gate electrode;
an inter-insulating layer disposed on the semiconductor layer and comprising source and drain contact holes formed therein and exposing portions of the semiconductor layer, wherein at least one edge of each of the source and drain contact holes of the inter-insulating layer overlaps the gate electrode; and
source and drain electrodes disposed on the exposed portions of the semiconductor layer,
wherein the semiconductor layer comprises conductive regions corresponding to the exposed portions of the semiconductor layer in the source and drain contact holes.

8. The TFT of claim 7, wherein the semiconductor layer comprises a metal induced crystallization (MIC) region and a metal induced lateral crystallization (MILC) region and is crystallized by an MILC technique.

9. The TFT of claim 8, wherein the MIC region corresponds to the exposed portions of the semiconductor layer in the source and drain contact holes.

10. The TFT of claim 7, wherein the source and drain electrodes directly contact the exposed portions of the semiconductor layer.

11. The TFT of claim 7, wherein the edges of the source and drain contact holes are separated from all edges of the semiconductor layer crossing over the gate electrode among all the edges of the semiconductor layer.

12. The TFT of claim 7, wherein the semiconductor layer crosses over the gate electrode in a substantially orthogonal configuration.

* * * * *